United States Patent
Nozawa

(10) Patent No.: US 8,637,764 B2
(45) Date of Patent: Jan. 28, 2014

(54) BIAXIALLY ORIENTED POLYESTER FILM FOR SEALING BACK SURFACE OF PHOTOVOLTAICS

(75) Inventor: Koutarou Nozawa, Shiga-ken (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

(21) Appl. No.: 13/394,180

(22) PCT Filed: Sep. 13, 2010

(86) PCT No.: PCT/JP2010/065761
§ 371 (c)(1),
(2), (4) Date: Mar. 26, 2012

(87) PCT Pub. No.: WO2011/030896
PCT Pub. Date: Mar. 17, 2011

(65) Prior Publication Data
US 2012/0178897 A1    Jul. 12, 2012

(30) Foreign Application Priority Data

Sep. 14, 2009 (JP) ................................ 2009-211943

(51) Int. Cl.
*C08G 63/183* (2006.01)
*C08J 5/18* (2006.01)
*H01L 31/042* (2006.01)

(52) U.S. Cl.
USPC .......................... 136/256; 428/480; 528/308.1

(58) Field of Classification Search
USPC ........................................................ 525/437
See application file for complete search history.

(56) References Cited

U.S. PATENT DOCUMENTS

| 2,823,421 A | * | 2/1958 | Scarlett | .......................... 264/216 |
| 2009/0139564 A1 | * | 6/2009 | Miyaji et al. | ................... 136/251 |

FOREIGN PATENT DOCUMENTS

| EP | 2262000 A1 | * | 12/2010 | .............. H01L 31/04 |
| JP | 2004043540 A | * | 2/2004 | .............. C08G 63/86 |
| JP | 2004-296865 | | 10/2004 | |
| JP | 2007-145703 | | 6/2007 | |
| JP | 2007-150084 | | 6/2007 | |
| JP | 2008-321399 | | 10/2008 | |
| WO | WO 2007/040039 | | 4/2007 | |
| WO | WO 2007040039 A1 | * | 4/2007 | .............. H01L 31/042 |
| WO | WO 2009123357 A1 | * | 10/2009 | .............. H01L 31/04 |

OTHER PUBLICATIONS

International Search Report for PCT/JP2010/065761, mailed Oct. 12, 2010.

* cited by examiner

*Primary Examiner* — Randy Gulakowski
*Assistant Examiner* — Christopher M Rodd
(74) *Attorney, Agent, or Firm* — Nixon & Vanderhye P.C.

(57) ABSTRACT

The present invention provides a biaxially oriented polyester film for a backsheet of photovoltaics which exhibits an excellent hydrolysis resistance and a low shrinkage rate. The present invention relates to a biaxially oriented polyester film for a backsheet of photovoltaics, comprising a polyester having an intrinsic viscosity of 0.65 to 0.90 dL/g as measured in a mixed solvent comprising phenol and tetrachloroethane at a mass ratio of 50/50 at 23° C., a carboxyl end group content of 0 to 26 equivalents/t, and a phosphorus element content of 0 to 170 ppm, which biaxially oriented polyester film has a shrinkage rate of not more than 0.8% as measured in a longitudinal direction thereof after subjected to heat treatment at 150° C. for 30 min.

4 Claims, No Drawings

BIAXIALLY ORIENTED POLYESTER FILM FOR SEALING BACK SURFACE OF PHOTOVOLTAICS

This application is the U.S. national phase of International Application No. PCT/JP2010/065761 filed 13 Sep. 2010 which designated the U.S. and claims priority to JP Patent Application No. 2009-211943 filed 14 Sep. 2009, the entire contents of each of which are hereby incorporated by reference.

TECHNICAL FIELD

The present invention relates to a biaxially oriented polyester film for a backsheet of photovoltaics which exhibits a good hydrolysis resistance and a low shrinkage rate.

BACKGROUND ART

Solar power generation (photovoltaic power generation) in which a light energy is converted into an electric energy by a photoelectric transfer effect has been extensively used as a means for attaining a clean energy. With the recent enhancement in photoelectric transfer efficiency of photovoltaics, solar power generation systems have been installed even in a large number of individual houses. In order to employ these solar power generation systems as a practical power source, there has been used a solar battery module having a plurality of solar battery cells which are connected in series to each other.

Since the solar battery module is used under high-temperature and high-humidity environmental conditions for a long period of time, a film for a backsheet of photovoltaics as a constitutional member of the photovoltaics is also required to exhibit a long-term durability. For example, there has been proposed the technique in which a based film is used as the film for a backsheet of fluorine-photovoltaics (Patent Document 1). In the thus proposed technique, it is described that the fluorine-based film is previously subjected to heat treatment to reduce a shrinkage rate of the fluorine-based film, so that there can be obtained the effect of preventing deterioration in properties including weather resistance and water resistance when subjected to vacuum lamination with ethylene vinyl acetate (hereinafter occasionally referred to merely as "EVA") as a sealing material as well as the effect of enhancing a yield of the film.

However, the fluorine-based film has a relatively low rigidity and therefore tends to be difficult to handle. Further, since the fluorine-based film is expensive as compared to generally used resin films, there tends to arise such a problem that a solar battery module produced using such a fluorine-based film is also expensive.

Conventionally, it has been attempted to use a polyester-based film as the film for a backsheet of photovoltaics in place of the above fluorine-based film. In general, as is known in the art, when using the polyester-based film under high-temperature and high-humidity environmental conditions, there tends to occur such a problem that the polyester-based film suffers from hydrolysis at an ester bond moiety in a molecular chain thereof, so that mechanical properties of the polyester-based film tend to be deteriorated. In consequence, in view of such a case that the polyester-based film for the solar battery module is used outdoors over a long period of time (for example, over 20 years) or under high-temperature and high-humidity environmental conditions, there have been made various studies for suppressing occurrence of hydrolysis of the polyester.

It is known that the rate of hydrolysis of a polyester becomes higher as a content of a carboxyl end group in a molecular chain of the polyester is increased. Therefore, there has been proposed such a technique that by adding a compound capable of reacting a carboxylic acid, the amount of a carboxyl group being present in a terminal end of a molecular chain of a polyester is reduced to thereby enhance a hydrolysis resistance of the polyester (Patent Documents 2 and 3). However, addition of the above compound tends to induce gelation of the material upon melt extrusion step or a material recycling step in a film formation process to generate foreign matters, resulting in deteriorated quality and high product costs, as well as high burdens on environments. In addition, the polyester-based film has a high shrinkage rate and therefore is unsuitable as films used for production of solar battery modules.

PRIOR DOCUMENTS

Patent Documents

Patent Document 1: Japanese Patent Application Laid-Open (KOKAI) No. 2002-83978
Patent Document 2: Japanese Patent Application Laid-Open (KOKAI) No. 9-227767
Patent Document 3: Japanese Patent Application Laid-Open (KOKAI) No. 8-73719

SUMMARY OF THE INVENTION

Problems to be Solved by the Invention

The present invention has been accomplished to solve the above problems. An object of the present invention is to provide a biaxially oriented polyester film for a backsheet (for sealing a back surface) of photovoltaics (solar batteries) which exhibits an excellent hydrolysis resistance and a low shrinkage rate.

Means for Solving Problems

As a result of the present inventors' earnest study, it has been found that the above problems can be solved by using a polyester film having a specific structure. The present invention has been attained on the basis of this finding.

That is, according to the present invention, there is provided a biaxially oriented polyester film for a backsheet of photovoltaics, comprising a polyester having an intrinsic viscosity of 0.65 to 0.90 dL/g as measured in a mixed solvent comprising phenol and tetrachloroethane at a mass ratio of 50/50 at 23° C., a carboxyl end group content of 0 to 26 equivalents/t, and a phosphorus element content of 0 to 170 ppm, which biaxially oriented polyester film has a shrinkage rate of not more than 0.8% as measured in a longitudinal direction thereof after subjected to heat treatment at 150° C. for 30 min.

Effect of the Invention

In accordance with the present invention, there is provided a biaxially oriented polyester film for a backsheet of photovoltaics which exhibits and excellent hydrolysis resistance and a low shrinkage rate. Therefore, the present invention has a very high industrial value in solar power generation application fields.

PREFERRED EMBODIMENTS FOR CARRYING OUT THE INVENTION

The present invention is described in more detail below.

The polyester used in the biaxially oriented polyester film according to the present invention (hereinafter occasionally referred to merely as a "polyester film") means such a polyester which may be obtained by polycondensing an aromatic dicarboxylic acid and an aliphatic glycol. Examples of the aromatic dicarboxylic acid include terephthalic acid and 2,6-naphthalenedicarboxylic acid. Examples of the aliphatic glycol include ethylene glycol, diethylene glycol and 1,4-cyclohexanedimethanol. Typical examples of the polyesters include polyethylene terephthalate (PET) and polyethylene-2,6-naphthalene dicarboxylate (PEN). Among these polyesters, preferred is polyethylene terephthalate (PET).

The polyester film according to the present invention which is produced using the above polyester is required to satisfy all of the requirements including an intrinsic viscosity, a carboxyl end group content, and a phosphorus element content as explained hereinafter.

[Intrinsic Viscosity]

The polyester as a raw material of the polyester film according to the present invention preferably has an intrinsic viscosity of usually 0.66 to 1.20 dL/g, and more preferably 0.70 to 0.90 dL/g as measured in a mixed solvent comprising phenol and tetrachloroethane at a mass ratio of 50/50 at 23° C. When the intrinsic viscosity of the polyester is not less than 0.66 dL/g, the resulting polyester film is preferably used from the standpoints of long-term durability and hydrolysis resistance. On the other hand, unless using the polyester having an intrinsic viscosity of not more than 1.20 dL/g, the polyester film tends to be deteriorated in productivity since a melting stress thereof tends to be excessively large upon being kneaded.

The intrinsic viscosity of the polyester film according to the present invention is required to lie within the range of 0.65 to 0.90 dL/g, and is preferably 0.68 to 0.70 dL/g. When the intrinsic viscosity of the polyester film is less than 0.65 dL/g, the resulting film may fail to exhibit good long-term durability and hydrolysis resistance. On the other hand, when the intrinsic viscosity of the polyester film exceeds 0.90 dL/g as an upper limit thereof, there tend to arise the problems such as deterioration in polycondensation reaction efficiency and increase in pressure in melt extrusion step, etc.

[Carboxyl End Group]

In the polyester film according to the present invention, the carboxyl end group content in the polyester constituting the film is required to lie within the range of 0 to 26 equivalents/t. The upper limit of the carboxyl end group content is not more than 26 equivalents/t and preferably not more than 24 equivalents/t. When the carboxyl end group content in the polyester is more than 26 equivalents/t, the polyester component tends to be deteriorated in hydrolysis resistance. On the other hand, in view of hydrolysis resistance, the lower limit of the carboxyl end group content in the polyester component is preferably 0 equivalent/t. From the viewpoints of polycondensation reaction efficiency and thermal decomposition in the melt extrusion step, etc., the lower limit of the carboxyl end group content in the polyester component is usually about 5 equivalents/t.

[Phosphorus Element]

In the polyester film according to the present invention, the phosphorus element content therein as detected by analysis using the below-mentioned X-ray fluorescence analyzer is present within a specific range. The phosphorus element is usually derived from a phosphoric acid compound added upon production of the polyester. In the present invention, the phosphorus element content in the polyester component is required to lie within the range of 0 to 170 ppm. The phosphorus element content in the polyester component is preferably 50 to 170 ppm, and more preferably 50 to 150 ppm. When the phosphorus element content in the polyester component satisfies the above-specified range, a high hydrolysis resistance can be imparted to the film. When the phosphorus element content in the polyester component is excessively large, the resulting film tends to suffer from undesirably accelerated hydrolysis.

Examples of the phosphoric acid compound include known compounds such as phosphoric acid, phosphonic acid, phosphinic acid and ester compounds thereof. Specific examples of the phosphoric acid compound include orthophosphoric acid, dimethyl phosphate, trimethyl phosphate, diethyl phosphate, triethyl phosphate, dipropyl phosphate, tripropyl phosphate, dibutyl phosphate, tributyl phosphate, diamyl phosphate, triamyl phosphate, dihexyl phosphate, trihexyl phosphate, diphenyl phosphate, triphenyl phosphate and ethyl acid phosphate.

Also, in order to suppress occurrence of thermal decomposition or hydrolysis, the content of the metal compound in the film which may act as the catalyst is preferably adjusted to as small a level as possible. On the other hand, for the purpose of enhancing a productivity of the film, metals such as magnesium, calcium, lithium and manganese may be incorporated in an amount of usually not more than 300 ppm and preferably not more than 250 ppm in the polyester component to reduce a volume resistivity thereof upon melting. In addition, when adopting a master batch method for the purpose of compounding the below-mentioned particles or various additives in the polyester, antimony may be incorporated as a metal component of the polymerization catalyst. Meanwhile, the metal compound as used herein does not include the below-mentioned particles to be compounded in the polyester.

The film of the present invention may be compounded with particles capable of imparting an easy-slipping property, if required, for the purpose of mainly imparting an easy-slipping property to the film. The particles to be compounded in the film are not particularly limited, and any particles can be used as long as they are capable of imparting an easy-slipping property to the film. Specific examples of the particles include particles of silica, calcium carbonate, magnesium carbonate, barium carbonate, calcium sulfate, calcium phosphate, magnesium phosphate, silicon oxide, kaolin, aluminum oxide and the like. In addition, there may also be used heat-resistant organic particles as described in Japanese Patent Publication (KOKOKU) No. 59-5216, Japanese Patent Application Laid-Open (KOKAI) No. 59-217755, etc. Examples of the heat-resistant organic particles include particles of thermosetting urea resins, thermosetting phenol resins, thermosetting epoxy resins, benzoguanamine resins or the like. Further, there may also be used deposited particles produced by precipitating or finely dispersing a part of the metal compounds such as the catalyst during the step for production of the polyester.

On the other hand, the shape of the particles compounded in the film is not particularly limited, and may be any of a spherical shape, a massive shape, a bar shape, a flat shape, etc. Further, the hardness, specific gravity, color tone and the like of the particles are also not particularly limited. A series of these particles may be used in combination of any two or more kinds thereof, if required.

Also, the average particle diameter of the particles used is preferably 0.01 to 10 μm. When the average particle diameter of the particles is not less than 0.01 μm, it is possible to impart an effect of imparting an easy-slipping property to the resulting film. On the other hand, when the average particle diameter of the particles is not more than 10 μm, it is possible to prevent the resulting film from suffering from breakage upon production of the film, and maintain a good productivity of the film.

Meanwhile, in the polyester film of the present invention, in addition to the above particles, various conventionally known additives such as an antioxidant, a thermal stabilizer, a lubricant, an antistatic agent and a dye may be added thereto, if required. Also, for the purpose of enhancing a weather resistance, an ultraviolet absorber may be added to the polyester film in an amount of 0.01 to 5.0 parts by mass based on the weight of the polyester component. In particular, the benzoxazinone-based ultraviolet absorbers, etc., are preferably used.

The thickness of the polyester film according to the present invention is not particularly limited as long as it lies within the range capable of forming a film shape, and is usually in the range of 10 to 500 μm, preferably 15 to 400 μm and more preferably 20 to 300 μm.

In the present invention, using two or three or more melting extruders, it is possible to produce a multi-layer film having two layers or three or more layers by a so-called co-extrusion method. As the layer structure of the resulting multi-layer film, there may be mentioned a layer structure of A/B or A/B/A using a raw material A and a raw material B, a layer structure of A/B/C further using a raw material C, and the other layer structures.

The polyester film obtained using the above polyester according to the present invention is required to have a shrinkage rate of not more than 0.8% as measured in a longitudinal direction (film-forming direction or MD direction) thereof after subjected to heat treatment at 150° C. for 30 min. The shrinkage rate of the polyester film is preferably not more than 0.6% and more preferably not more than 0.4%. When the shrinkage rate of the polyester film is more than 0.8%, the polyester film tends to suffer from curling or displacement of solar battery cells sealed in EVA owing to contraction of the polyester film in a vacuum lamination step upon production of the solar battery module.

In the following, the process for producing the polyester film according to the present invention is more specifically explained below. However, the following production process is only illustrative and not intended to limit the present invention thereto, and the other modification and changes are also possible as long as they can meet with the scope of the present invention.

That is, polyester chips (polyester components) which are dried by known methods or kept undried are fed to a kneading extruder and heated to a temperature not lower than a melting point of the respective polyester components for melting the polyester chips. Then, the thus obtained molten polyesters are extruded through a die onto a rotary cooling drum and rapidly cooled to a temperature not higher than a glass transition temperature thereof and solidified, thereby obtaining a substantially amorphous non-oriented sheet. In this case, in order to enhance a flatness or surface smoothness of the sheet, it is preferred to improve pinning properties of the sheet to the rotary cooling drum. For this purpose, in the present invention, an electrostatic pinning method and/or a liquid coating adhesion method are preferably used. Even in the melt-extrusion step, the carboxyl end group content in the polyester tends to be increased according to the conditions used. Therefore, in the present invention, there are preferably adopted a method of shortening a residence time of the polyester in the extruder during the extrusion step, a method of previously drying the raw material to a sufficient extent such that the water content therein is preferably controlled to not more than 50 ppm and more preferably not more than 30 ppm in the case of using a single-screw extruder, a method of providing a vent port on a twin-screw extruder to maintain an inside of the extruder at a reduced pressure of preferably not more than 40 hPa, more preferably not more than 30 hPa and still more preferably not more than 20 hPa, etc.

In the present invention, the thus obtained sheet is biaxially stretched to form a film. More specifically, the stretching may be conducted under the following conditions. That is, the unstretched sheet is preferably stretched in a longitudinal direction (MD direction) thereof at a temperature of 70 to 145° C. and a draw ratio of 2 to 6 times to form a longitudinally monoaxially stretched film, and then the monoaxially stretched film is stretched in a lateral direction (TD direction) thereof at a temperature of 90 to 160° C. and a draw ratio of 2 to 6 times to form a biaxially stretched film. The resultant biaxially stretched film is further subjected to heat-setting step.

The heat-setting is preferably accomplished by subjecting the polyester film to heat treatment at a temperature of 160 to 240° C. and more preferably 170 to 230° C. for 1 to 600 sec. When the heat-setting temperature is not lower than 160° C., the shrinkage rate of the polyester film in a longitudinal direction thereof can be reduced, and the polyester film can be subjected to annealing treatment under moderate conditions, so that the resulting film can be practically used without occurrence of severe distortion. On the other hand, when the heat-setting temperature is not higher than 240° C., it is possible to obtain a polyester film having a good hydrolysis resistance.

The "annealing treatment" as used in the present invention means that the thus heat-fixed biaxially stretched polyester film is subjected to heat treatment in substantially non-tensioned state.

The heat-treating temperature upon the annealing treatment is preferably in the range of from a glass transition temperature of the biaxially oriented polyester film to a temperature lower by 40° C. or more than a melting point thereof.

Upon the annealing treatment, if a large tensile force is applied to the biaxially oriented polyester film, the film tends to undergo undesirable stretching. Therefore, the film is preferably subjected to the annealing treatment in substantially non-tensioned state. The "substantially non-tensioned state" specifically means that the annealing treatment is carried out under a film tension of not more than 1000 (mN/mm$^2$), preferably not more than 800 and more preferably not more than 600.

As the configuration of the annealing treatment, there may be considered either an in-line annealing method in which the annealing treatment is carried out during the production process of the film or an off-line annealing method in which the annealing treatment is carried out after production of the film. Among these methods, the off-line annealing method is preferred because the annealing time is not restricted by the rate of production of the film.

The annealing time is not particularly limited and may vary depending upon a thickness of the biaxially stretched polyester film, an annealing temperature, etc., and is in general preferably not less than 5 sec, more preferably 10 sec to 60 min and still more preferably 30 sec to 20 min.

The infrared heating furnace used for conducting the annealing treatment is not particularly limited. For example, there may be suitably used such a heating furnace in which a number of infrared heaters each having a large width capable of covering an entire width of the film being traveled therein are disposed at predetermined intervals along an upper portion of the heating furnace.

As the infrared heater, there may be used both of a near infrared heater and a far infrared heater including a sheathed heater. From the viewpoint of a less damage to the film, among these heaters, preferred is the near infrared heater.

The film is heat-treated by adjusting an atmosphere temperature within the heating furnace to a predetermined value. The atmosphere temperature within the furnace may be adjusted, for example, by the following method. The temperature-detecting probe tips of a thermocouple are disposed between the adjacent heaters in the furnace at the near-film position apart by about 5 cm above the film being traveled to measure an atmosphere temperature at the respective positions. The atmosphere temperature may be variably controlled by adjusting an output of the individual heaters disposed, the number of the heaters, a distance between the heaters disposed, a distance between the film being traveled and the heater, ventilation within the furnace, etc. For example, when the output of a variable-output bar-shaped near infrared heater is controlled in the range of 0.5 to 1.2 kW/m while appropriately ventilating an inside of the furnace with a constant amount of air, the atmosphere temperature at the position near the film can be controlled in a suitable range, i.e., in the range of 150 to 220° C.

The feature of the infrared heating furnace resides in that the heating effect thereof is equal to or higher than that of a hot air type heating furnace even when the atmosphere temperature at the position near to the film being traveled in the infrared heating furnace is present in the range lower than the atmosphere temperature at the same position in the hot air type heating furnace. For this reason, the use of the infrared heating furnace can exhibit many advantages such as shortened treating time and high efficiency as well as reduction in film distortion owing to the shortened treating time which have been unachievable by the hot air type heating furnace.

When subjecting the polyester film to the above annealing treatment, it is possible to control the shrinkage rate of the polyester film to not more than 0.8% as measured in a longitudinal direction thereof after subjected to heat treatment at 150° C. for 30 min.

The hydrolysis resistance of the polyester film is a property relating to a whole portion of the film. In the present invention, in the case of the film having a laminated structure which is produced by the co-extrusion method, it is required that the phosphorus element content, the carboxyl end group content and the intrinsic viscosity in the polyester component as a whole constituting the film lie within the above-specified ranges. Meanwhile, the phosphorus element content based on a whole portion of the film may be measured as follows. That is, the multi-layer film is melted and molded into a disk shape, and the disk-shaped molded product is subjected to measurement of the phosphorus element content.

In the present invention, in order to control the carboxyl end group content in the polyester component in the polyester film to the specific range, the residence time of the polyester component, for example, in an extruder used in an extrusion step of polyester chips, is shortened to thereby obtain the polyester film. In addition, polyester chips having a low carboxyl end group content may be formed into a film shape to obtain the polyester film whose carboxyl end group content lies within the above-specified range. Further, when a reclaimed raw material obtained through a melting step is compounded to the above raw polyester upon production of the film, the carboxyl end group content in the polyester component tends to be increased out of the above-specified range. Therefore, in the present invention, none of such a reclaimed raw material is preferably compounded, and even if compounded, the reclaimed raw material is preferably added in an amount of not more than 40 parts by mass and more preferably not more than 20 parts by mass.

In the present invention, during or after the above stretching step, in order to impart an adhesion property, an antistatic property, a slipping property, a releasing property, etc., to the film, a coating layer may be formed on one or both surfaces of the film, or the film may be subjected to discharge treatment such as corona treatment.

EXAMPLES

The present invention is described in more detail below by the following Examples. However, these Examples are only illustrative and not intended to limit the present invention thereto, and other variations and modifications are possible unless they depart from the scope of the present invention. Meanwhile, the methods for measuring and evaluating various properties of the film are as follows.

(1) Phosphorus Element Content in Polyester Chips and Polyester Film

Using an X-ray fluorescence analyzer "Model No.: XRF-1500" manufactured by Shimadzu Corp., the polyester chips or the polyester film were subjected to a single chip measurement for the polyester chips or a single sheet measurement for the polyester film under the conditions shown in Table 1 below to measure the phosphorus element content in the polyester chips or the polyester film.

TABLE 1

| | |
|---|---|
| X-ray tube target | TH4.0 kW |
| Voltage (kV) | 40 |
| Current (mA) | 95 |
| Analyzing crystal | Ge |
| Detector | FPC |
| 2θ (deg) | 141.03 |
| Measuring time (sec); two-point background; 20 sec for each | 40 |

(2) Carboxyl End Group Content in Polyester Chips and Polyester Film

The polyester chips or the polyester film were milled and then dried at 140° C. for 15 min using a hot air dryer, and further cooled to room temperature in a desiccator to prepare a sample. The thus prepared sample was accurately weighed in an amount of 0.1 g and placed in a test tube. The test tube was further charged with 3 mL of benzyl alcohol, and the contents of the test tube were dissolved at 195° C. for 3 min while blowing a dry nitrogen gas thereinto. Next, 5 mL of chloroform were gradually added to the resulting solution, and the contents of the test tube were cooled to room temperature. One or two droplets of a phenol red indicator were added to the above solution, and the solution was subjected to titration using a 0.1 (N) sodium hydroxide benzyl alcohol solution while blowing a dry nitrogen gas thereinto. The titration was terminated at the time at which the color of the solution was changed from yellow to red. In addition, a material comprising no polyester resin sample as a blank was subjected to the same procedure as defined above to calculate an acid value of the polyester according to the following formula.

$$\text{Acid value (equivalent}/t) = (A-B) \times 0.1 \times f/W$$

wherein A is an amount (μL) of the 0.1 (N) sodium hydroxide benzyl alcohol solution used in titration of the polyester resin sample; B is an amount (μL) of the 0.1 (N) sodium hydroxide benzyl alcohol solution used in titration of the blank; W is an amount (g) of the polyester resin sample; and f is a titer of the 0.1 (N) sodium hydroxide benzyl alcohol solution.

Meanwhile, the titer (f) of the 0.1 (N) sodium hydroxide benzyl alcohol solution was measured as follows. That is, 5 mL of methanol was sampled in a test tube, and one or two droplets of a phenol red indicator were added to the test tube, and the resulting solution was subjected to titration using 0.4 mL of a 0.1 (N) sodium hydroxide benzyl alcohol solution until reaching a point at which a color of the solution was changed. Next, 0.2 mL of a 0.1 (N) hydrochloric acid aqueous solution as a standard solution having a known titer was sampled and subjected again to titration using the 0.1 (N) sodium hydroxide benzyl alcohol solution until reaching a point at which a color of the solution was changed. The above procedures were conducted while blowing a dry nitrogen gas into the solution. The titer (f) was calculated according to the following formula.

Titer $(f)$=(titer of the 0.1($N$) hydrochloric acid aqueous solution)×(amount(μ$L$) of 0.1($N$) hydrochloric acid aqueous solution sampled)/(amount(μ$L$) of the 0.1($N$) sodium hydroxide benzyl alcohol solution used in the titration)

(3) Intrinsic Viscosity of Polyester Chips and Polyester Film

The polyester chips or the polyester film were dissolved in a mixed solvent comprising phenol and tetrachloroethane at a weight ratio of 50/50 at 23° C. The resulting solution having a concentration of 1.0 (g/dL) was subjected to measurement of a falling time thereof using a capillary tube viscometer, and the solvent only was also subjected to the same measurement of a falling time thereof. The intrinsic viscosity (dL/g) of the polyester at 23° C. was calculated from a ratio between the falling times according to a Huggins's formula in which a Huggins's constant was assumed to be 0.33.

(4) Glass Transition Temperature (Tg)

Using a dynamic viscoelasticity meter "DVA-200" (tradename) manufactured by I.T. Keisoku Seigyo K.K., the polyester film was tested to measure a dispersion peak temperature of a loss tangent (tan δ) thereof at a frequency of 10 Hz and a temperature rise rate of 10° C./min, as a glass transition temperature of the polyester.

(5) Melting Point (Tm)

Using a differential scanning calorimeter "DSC-7 Model" manufactured by Perkin Elmer Inc., an endothermic peak temperature of the polyester was measured by fusion of crystals thereof obtained at a temperature rise rate of 10° C./min, and regarded as a melting point of the polyester.

(6) Heat Shrinkage Rate of Film

The film sample was subjected to heat treatment in an atmosphere of 150° C. for 30 min in a non-tensioned state to measure a length of the sample in each of an MD direction (longitudinal direction) and a TD direction (width direction) thereof before and after the heat treatment. From the thus measured values, the heat shrinkage rate of the polyester film was calculated according to the following formula.

$$\text{Heat shrinkage rate (\%)} = (L1-L0)/L0 \times 100$$

wherein L1 (mm) is a length of the sample before the heat treatment; and L0(mm) is a length of the sample after the heat treatment.

(7) Hydrolysis Resistance Test

Using a personal pressure cracker (manufactured by Hirayama Manufacturing Corp.), the polyester film was treated in an atmosphere of 120° C. and 100% RH for 96 hr. Next, using a precise universal tester "AUTOGRAPH AG-1" (tradename) manufactured by Shimadzu Corp., an elongation at break of the film in a longitudinal direction (film-forming direction or MD direction) thereof as mechanical properties of the film was measured at a rate of 20 mm/min. The retention rates (%) of the elongation at break before and after the above treatment were respectively calculated from the following formula, and the hydrolysis resistance of the film was evaluated according to the following ratings.

Retention rate (%) of elongation at break=(elongation at break after treatment)÷(elongation at break before treatment)×100

A: The retention rate was not less than 50%;
B: The retention rate was not less than 5% and less than 50%; and
C: The retention rate was less than 5%.

(8) Total Evaluation

The film was subjected to total evaluation according to the following ratings.

A: The heat shrinkage rate in a longitudinal direction of the film was not more than 0.8%, and the evaluation rating of the hydrolysis resistance was A;
B: The heat shrinkage rate in a longitudinal direction of the film was not more than 0.8%, and the evaluation rating of the hydrolysis resistance was B; and
C: The heat shrinkage rate in a longitudinal direction of the film was more than 0.8%, and the evaluation rating of the hydrolysis resistance was C.

<Method for Production of Polyester (1)>

A reaction vessel was charged with 100 parts by mass of dimethyl terephthalate and 60 parts by mass of ethylene glycol as starting materials as well as 0.09 part by mass of calcium acetate as a catalyst, and the reaction temperature in the reaction vessel was gradually raised from 150° C. as a reaction initiation temperature while distilling off methanol as produced until reaching 230° C. after 3 hr.

After the elapse of 4 hr, the transesterification reaction was substantially terminated. The resulting reaction mixture was mixed with 0.04 part by mass of antimony trioxide and 0.08 part by mass of silica particles having an average particle diameter of 2.6 μm in the form of a dispersion in ethylene glycol, and the resulting mixture was subjected to polycondensation reaction for 4 hr. That is, in the above polycondensation reaction, the reaction temperature was gradually raised from 230° C. and finally allowed to reach 280° C. On the other hand, the reaction pressure was gradually dropped from normal pressures and finally allowed to reach 40 Pa. After initiation of the reaction, the change in agitation power in the reaction vessel was monitored, and the reaction was terminated at the time at which the agitation power reached the value corresponding to an intrinsic viscosity of 0.60 dL/g. The resulting polymer was withdrawn from the reaction vessel under application of a nitrogen pressure. As a result, it was confirmed that the thus obtained polyester (1) had an intrinsic viscosity of 0.60 dL/g, a carboxyl end group content of polymer of 35 equivalents/t and a phosphorus element content of 0 ppm.

<Method for Production of Polyester (2)>

The polyester (1) as a starting material was subjected to solid state polymerization at 220° C. in vacuo to thereby obtain a polyester (2). As a result, it was confirmed that the thus obtained polyester (2) had an intrinsic viscosity of 0.74 dL/g, a carboxyl end group content of polymer of 9 equivalents/t and a phosphorus element content of 0 ppm.

<Method for Production of Polyester (3)>

The same procedure as defined in the above method for production of the polyester (1) was conducted except that after completion of the transesterification reaction, 0.094 part by mass of orthophosphoric acid (0.03 part by mass in terms of phosphorus atom) was added to the reaction solution, and then 0.04 part by mass of antimony trioxide and 0.08 part by mass of silica particles having an average particle diameter of 2.6 μm in the form of a dispersion in ethylene glycol were added thereto, thereby obtain a polyester (3). As a result, it was confirmed that the thus obtained polyester (3) had an intrinsic viscosity of 0.63 dL/g, a carboxyl end group content of polymer of 14 equivalents/t and a phosphorus element content of 299 ppm.

<Method for Production of Polyester (4)>

The polyester (3) as a starting material was subjected to solid state polymerization at 220° C. in vacuo to thereby obtain a polyester (4). As a result, it was confirmed that the thus obtained polyester (4) had an intrinsic viscosity of 0.69 dL/g, a carboxyl end group content of polymer of 12 equivalents/t and a phosphorus element content of 299 ppm.

<Method for Production of Polyester (5)>

A reaction vessel was charged with 100 parts by mass of dimethyl terephthalate and 60 parts by mass of ethylene glycol as starting materials as well as 0.02 part by mass of magnesium acetate tetrahydrate as a catalyst, and the reaction temperature in the reaction vessel was gradually raised from 150° C. as a reaction initiation temperature while distilling off methanol as produced until reaching 230° C. after 3 hr. After the elapse of 4 hr, the transesterification reaction was substantially terminated. The resulting reaction mixture was mixed with 0.136 part by mass of ethyl acid phosphate (0.03 part by mass in terms of phosphorus atom), and then transferred to a polycondensation vessel. The polycondensation vessel was charged with 0.04 part by mass of antimony trioxide, and the resulting mixture was subjected to polycondensation reaction for 4 hr. That is, in the above polycondensation reaction, the reaction temperature was gradually raised from 230° C. and finally allowed to reach 280° C. On the other hand, the reaction pressure was gradually dropped from normal pressures and finally allowed to reach 40 Pa. After initiation of the reaction, the change in agitation power in the reaction vessel was monitored, and the reaction was terminated at the time at which the agitation power reached the value corresponding to an intrinsic viscosity of 0.63 dL/g. The resulting polymer was withdrawn from the reaction vessel under application of a nitrogen pressure, thereby obtaining chips of a polyester (5). As a result, it was confirmed that the thus obtained polyester had an intrinsic viscosity of 0.63 dL/g, a carboxyl end group content of polymer of 51 equivalents/t and a phosphorus element content of 299 ppm.

<Method for Production of Polyester (6)>

The polyester (5) as a starting material was subjected to solid state polymerization at 220° C. in vacuo to thereby obtain a polyester (6). As a result, it was confirmed that the thus obtained polyester (6) had an intrinsic viscosity of 0.85 dL/g, a carboxyl end group content of polymer of 45 equivalents/t and a phosphorus element content of 299 ppm.

Example 1

The above polyester (2) and polyester (3) were mixed with each other at a mixing mass ratio of 80:20 to obtain a polyester mixture as a raw material. The resulting polyester mixture was melted and extruded at 290° C. using a vented twin-screw extruder onto a casting drum whose surface temperature was maintained at 40° C. to rapidly cool and solidify the mixture by an electrostatic pinning method, thereby forming an unstretched single-layer sheet. The thus obtained sheet was stretched at 83° C. at a draw ratio of 3.3 times in a longitudinal direction thereof. Then, the resulting monoaxially stretched sheet was introduced into a tenter, and then stretched at 110° C. at a draw ratio of 3.7 times in a lateral direction thereof. The thus biaxially stretched sheet was further subjected to heat-setting treatment at 220° C., thereby obtaining a film having a thickness of 50 μm.

The thus obtained film was passed through an infrared heater-direct heating furnace to thereby subject the film to annealing treatment in a zone having an atmosphere temperature of 150 to 210° C. for 9 sec under a film tension of 400 mN/mm². The properties and evaluation results of the thus obtained film are shown in Table 2 below.

Example 2

The same procedure as defined in Example 1 was conducted except that the polyester raw materials in the mixture were replaced with polyesters prepared by mixing the above polyester (2) and polyester (4) with each other at a mixing mass ratio of 40:60, thereby obtaining a film. The properties and evaluation results of the thus obtained film are shown in Table 2 below.

Example 3

The same procedure as defined in Example 1 was conducted except that the polyester raw materials in the mixture were replaced with polyesters prepared by mixing the above polyester (2) and polyester (4) with each other at a mixing mass ratio of 90:10, thereby obtaining a film. The properties and evaluation results of the thus obtained film are shown in Table 2 below.

Example 4

The same procedure as defined in Example 1 was conducted except that the polyester raw materials in the mixture were replaced with the above polyester (2) solely, thereby obtaining a film. The properties and evaluation results of the thus obtained film are shown in Table 2 below.

Example 5

The same procedure as defined in Example 1 was conducted except that the polyester raw materials in the mixture were replaced with polyesters prepared by mixing the above polyester (1) and polyester (2) with each other at a mixing mass ratio of 10:90, thereby obtaining a film. The properties and evaluation results of the thus obtained film are shown in Table 2 below.

Comparative Example 1

The same procedure as defined in Example 1 was conducted except that the polyester raw materials in the mixture were replaced with polyesters prepared by mixing the above polyester (2) and polyester (3) with each other at a mixing mass ratio of 40:60, thereby obtaining a film. The properties and evaluation results of the thus obtained film are shown in Table 2 below.

Comparative Example 2

The same procedure as defined in Example 1 was conducted except that the polyester raw materials in the mixture were replaced with the above polyester (4) solely, thereby obtaining a film. The properties and evaluation results of the thus obtained film are shown in Table 2 below.

Comparative Example 3

The same procedure as defined in Example 1 was conducted except that the polyester raw materials in the mixture were replaced with the above polyester (6) solely, thereby obtaining a film. The properties and evaluation results of the thus obtained film are shown in Table 2 below.

Comparative Example 4

The same procedure as defined in Example 1 was conducted except that no annealing treatment was conducted, thereby obtaining a film. The properties and evaluation results of the thus obtained film are shown in Table 2 below.

Comparative Example 5

The same procedure as defined in Example 1 was conducted except that the polyester raw materials in the mixture were replaced with polyesters prepared by mixing the above polyester (2) and polyester (6) with each other at a mixing mass ratio of 50:50, thereby obtaining a film. The properties and evaluation results of the thus obtained film are shown in Table 2 below.

TABLE 2

|  | Examples | | | | |
| --- | --- | --- | --- | --- | --- |
|  | 1 | 2 | 3 | 4 | 5 |
| Polyester (1) | 0 | 0 | 0 | 0 | 10 |
| Polyester (2) | 80 | 40 | 90 | 100 | 90 |
| Polyester (3) | 20 | 0 | 0 | 0 | 0 |
| Polyester (4) | 0 | 60 | 10 | 0 | 0 |
| Polyester (5) | 0 | 0 | 0 | 0 | 0 |
| Polyester (6) | 0 | 0 | 0 | 0 | 0 |
| Phosphorus element content (ppm) | 50 | 150 | 25 | 0 | 0 |
| Carboxyl end group content (equivalent/t) | 16 | 17 | 15 | 15 | 18 |
| Intrinsic viscosity (dL/g) | 0.67 | 0.66 | 0.69 | 0.69 | 0.68 |
| Heat-setting temperature (° C.) | 220 | 220 | 220 | 220 | 220 |
| Glass transition temperature (Tg) [° C.] | 120 | 121 | 121 | 121 | 121 |
| Melting point (Tm) [° C.] | 254 | 255 | 254 | 255 | 254 |
| Use or non-use of annealing treatment | Used | Used | Used | Used | Used |
| Heat shrinkage rate of film (MD/TD) | 0.1/0.1 | 0.1/0.1 | 0.2/0.2 | 0.2/0.2 | 0.1/0.1 |
| Hydrolysis resistance | B | B | A | A | B |
| Total evaluation | B | B | A | A | B |

TABLE 2-continued

|  | Comparative Examples | | | | |
| --- | --- | --- | --- | --- | --- |
|  | 1 | 2 | 3 | 4 | 5 |
| Polyester (1) | 0 | 0 | 0 | 0 | 0 |
| Polyester (2) | 40 | 0 | 0 | 80 | 50 |
| Polyester (3) | 60 | 0 | 0 | 20 | 0 |
| Polyester (4) | 0 | 100 | 0 | 0 | 0 |
| Polyester (5) | 0 | 0 | 0 | 0 | 0 |
| Polyester (6) | 0 | 0 | 100 | 0 | 50 |
| Phosphorus element content (ppm) | 150 | 250 | 249 | 50 | 140 |
| Carboxyl end group content (equivalent/t) | 18 | 18 | 51 | 16 | 32 |
| Intrinsic viscosity (dL/g) | 0.62 | 0.65 | 0.72 | 0.67 | 0.69 |
| Heat-setting temperature (° C.) | 220 | 220 | 220 | 220 | 220 |
| Glass transition temperature (Tg) [° C.] | 121 | 122 | 122 | 120 | 121 |
| Melting point (Tm) [° C.] | 254 | 255 | 254 | 255 | 255 |
| Use or non-use of annealing treatment | Used | Used | Used | Not used | Used |
| Heat shrinkage rate of film (MD/TD) | 0.2/0.2 | 0.2/0.2 | 0.2/0.2 | 1.8/1.0 | 0.3/0.1 |
| Hydrolysis resistance | C | C | C | A | C |
| Total evaluation | C | C | C | C | C |

From Table 2, it was recognized that in Examples 1 to 5 in which the biaxially oriented polyester films for a backsheet of photovoltaics according to the present invention were produced, the resulting films exhibited a low shrinkage rate and were excellent in hydrolysis resistance. On the other hand, it was recognized that the film obtained in Comparative Example 1 which had a low intrinsic viscosity, the film obtained in Comparative Example 2 which had a large phosphorus element content, the film obtained in Comparative Example 3 which had both a large carboxyl end group content and a large phosphorus element content, and the film obtained in Comparative Example 5 which had a large carboxyl end group content, all were deteriorated in hydrolysis resistance, whereas the film obtained in Comparative Example 4 which had an excessively high shrinkage rate was problematic.

INDUSTRIAL APPLICABILITY

The biaxially oriented polyester film according to the present invention exhibits an excellent hydrolysis resistance and a low shrinkage rate, and therefore is useful as a biaxially oriented polyester film for a backsheet of photovoltaics.

The invention claimed is:

1. A biaxially oriented polyester film for a backsheet of photovoltaics, consisting essentially of a polyester obtained by polycondensing materials consisting of an aromatic dicarboxylic acid and an aliphatic glycol, the biaxially oriented polyester film having an intrinsic viscosity of 0.65 to 0.90 dL/g as measured in a mixed solvent comprising phenol and tetrachloroethane at a mass ratio of 50/50 at 23° C., a carboxyl end group content of 0 to 26 equivalents/t, and a phosphorus element content of 0 to 170 ppm, which biaxially oriented polyester film has a shrinkage rate of not more than 0.8% as measured in a longitudinal direction thereof after subjected to heat treatment at 150° C. for 30 min.

2. A biaxially oriented polyester film for a backsheet of photovoltaics according to claim 1, wherein the biaxially oriented polyester film is annealed in a substantially nontensioned state in a temperature range of from a glass transition temperature of the biaxially oriented polyester film to a temperature lower by 40° C. or more than a melting point thereof.

3. The biaxially oriented polyester film of claim 1, wherein the phosphorus element content is 50 to 170 ppm.

4. The biaxially oriented polyester film of claim 1, wherein the phosphorus element content is 50 to 150 ppm.

* * * * *